United States Patent
She et al.

(10) Patent No.: US 11,464,136 B2
(45) Date of Patent: Oct. 4, 2022

(54) HYBRID COOLING FOR POWER ELECTRONICS UNIT

(71) Applicant: Carrier Corporation, Palm Beach Gardens, FL (US)

(72) Inventors: Xu She, Cohoes, NY (US); Ismail Agirman, Southington, CT (US)

(73) Assignee: Carrier Corporation, Palm Beach Gardens, FL (US)

( * ) Notice: Subject to any disclaimer, the term of this patent is extended or adjusted under 35 U.S.C. 154(b) by 0 days.

(21) Appl. No.: 17/302,161

(22) Filed: Apr. 26, 2021

(65) Prior Publication Data

US 2021/0352826 A1 Nov. 11, 2021

Related U.S. Application Data

(60) Provisional application No. 62/704,328, filed on May 5, 2020.

(51) Int. Cl.
*H05K 7/20* (2006.01)
*F25B 5/02* (2006.01)

(52) U.S. Cl.
CPC ........... *H05K 7/20354* (2013.01); *F25B 5/02* (2013.01); *H05K 7/20154* (2013.01);
(Continued)

(58) Field of Classification Search
CPC ........... H05K 7/20309; H05K 7/20318; H05K 7/20327; H05K 7/20354; H05K 7/20936;
(Continued)

(56) References Cited

U.S. PATENT DOCUMENTS 4,720,981 A * 1/1988 Helt .................... H05K 7/20936
165/80.4
6,041,609 A * 3/2000 Hornsleth ............... F04B 39/06
62/505

(Continued)

FOREIGN PATENT DOCUMENTS

EP 3093587 A1 11/2016

OTHER PUBLICATIONS

European Search Opinion in counterpart application EP21170642 (dated 2021).*

*Primary Examiner* — Zachary Pape
(74) *Attorney, Agent, or Firm* — Patricia S. Whitehouse

(57) ABSTRACT

A power electronics unit, a vapor compression system incorporating the power electronics unit, and a method of cooling a power electronics unit are provided. The power electronics unit includes a semiconductor portion and an inductor portion. Approximately 80% of the heat generated by the power electronics unit may be derived from the semiconductor portion. Approximately 20% of the heat generated by the power electronics unit may be derived from the inductor portion. The semiconductor portion is cooled using at least one fan. The inductor portion is cooled using a working fluid (e.g., a refrigerant). The working fluid may be provided from upstream of the evaporator in the vapor compression system. Limiting the use working fluid to only cool the inductor portion of the power electronics unit may minimize the impact of the power electronics unit on the vapor compression system.

18 Claims, 4 Drawing Sheets

(52) U.S. Cl.
CPC ..... *H05K 7/20309* (2013.01); *H05K 7/20318* (2013.01); *H05K 7/20909* (2013.01); *H05K 7/20936* (2013.01)

(58) Field of Classification Search
CPC ......... H05K 7/20909; F25B 2600/0253; F25B 25/02; F25B 5/02; F25B 31/006; F25B 1/00
See application file for complete search history.

(56) References Cited

U.S. PATENT DOCUMENTS

| | | | | |
|---|---|---|---|---|
| 7,021,075 | B2* | 4/2006 | Shindo | F04C 29/047 62/505 |
| 8,614,891 | B2* | 12/2013 | Nagano | H05K 7/20909 361/695 |
| 9,232,684 | B2* | 1/2016 | Aoki | H05K 7/20918 |
| 9,553,499 | B2* | 1/2017 | Handy | H01F 27/2823 |
| 10,962,009 | B2* | 3/2021 | Pham | F04B 39/123 |
| 11,252,847 | B2* | 2/2022 | Waddell | H05K 7/20309 |
| 2009/0314018 | A1* | 12/2009 | Burchill | F25B 31/006 62/239 |
| 2015/0315935 | A1* | 11/2015 | Myers | H05K 7/20927 60/648 |
| 2017/0127566 | A1* | 5/2017 | Imura | F04B 39/00 |
| 2019/0024950 | A1 | 1/2019 | Ebara et al. | |

* cited by examiner

HYBRID COOLING FOR POWER ELECTRONICS UNIT

CROSS REFERENCE TO A RELATED APPLICATION

The application claims the benefit of U.S. Provisional Application No. 62/704,328 filed May 5, 2020, the contents of which are hereby incorporated in their entirety.

BACKGROUND

Refrigerated trucks and trailers are commonly used to transport perishable goods, such as, for example, produce, meat, poultry, fish, dairy products, cut flowers, and other fresh or frozen perishable products. To maintain the perishable goods, typically, a transport refrigeration unit (TRU) is mounted to the truck or to the trailer. The transport refrigeration unit includes a compressor to circulate the refrigerant within the transport refrigeration unit. The compressor may be driven either mechanically (e.g., using a direct mechanical coupling or belt drive) or electrically. When mechanically driven, the compressor derives power from the vehicle engine. When electrically driven, the compressor can derive power either from a generator or an onboard battery.

The duty cycle of the compressor may vary depending on various factors, such as, for example, the ambient temperature, type and volume of cargo, the desired temperature for the cargo space, and the frequency and length of time that the cargo space is opened for loading or unloading. During a majority of the operating time, the compressor may be functioning at less than full capacity and, at times, may be completely shut off. For purposes of efficiency, it is therefore common to provide a control system for varying the operation (e.g., the speed) of the compressor. One way in which the operation of the compressor may be controlled is through use a power electronics unit. For example, a power electronics unit may be used to selectively vary the power being supplied to the compressor (e.g., by varying the current, voltage, and/or frequency). As such, the power electronics unit, when included, may be a critical component for the transport refrigeration unit.

If not cooled appropriately, the power electronics unit may overheat, which may damage the circuit components within the power electronics unit (e.g., potential making the power electronics unit inoperable) and/or present a product safety issue (e.g., due to the generation of heat). To prevent, or at least mitigate, the potential overheating of the power electronics unit, liquid cooling has been explored. For example, prior transport refrigeration units have included the power electronics unit within the vapor compression cycle of the transport refrigeration unit, where the entire power electronics unit is cooled by passing the entire volume of refrigerant through the power electronics unit (e.g., in series with the compressor). However, cooling the entire power electronics unit with refrigerant from the transport refrigeration unit may impact the ability of the transport refrigeration unit to provide efficient cooling for the perishable goods, as adding a heat source (i.e., the power electronics unit) will increase the cooling load.

Accordingly, there remains a need for a more efficient system and method of cooling a power electronics unit that minimize the impact on the source of the fluid used for cooling (e.g., the transport refrigeration unit).

BRIEF DESCRIPTION

According to one embodiment, a vapor compression system including a compressor, an evaporator, and a power electronics unit is provided. The compressor includes an electric drive motor for increasing the pressure of a working fluid. The evaporator is in fluid communication with the compressor. The evaporator is configured to transfer heat from an external medium to the working fluid. The power electronics unit is used for controlling the transfer of an electrical power to the electric drive motor. The power electronics unit includes a semiconductor portion and an inductor portion. The semiconductor portion includes at least one fan configured to transfer heat from the semiconductor portion. The inductor portion includes at least one conduit configured to receive at least a portion of the working fluid. The working fluid is configured to transfer heat from the inductor portion.

In accordance with additional or alternative embodiments, the inductor portion receives at least a portion of the working fluid from upstream of the evaporator.

In accordance with additional or alternative embodiments, the working fluid from the inductor portion is transferred to the compressor.

In accordance with additional or alternative embodiments, the working fluid from the inductor portion is transferred to the evaporator.

In accordance with additional or alternative embodiments, the heat generated by the power electronics unit is proportional to the transfer of the electrical power to the electric drive motor.

In accordance with additional or alternative embodiments, at least 60% of the heat generated by the power electronics unit is derived from the semiconductor portion.

In accordance with additional or alternative embodiments, less than 40% of the heat generated by the power electronics unit is derived from the inductor portion.

In accordance with additional or alternative embodiments, the at least one fan transfers substantially all of the heat derived from the semiconductor portion.

In accordance with additional or alternative embodiments, the working fluid transfers substantially all of the heat derived from the inductor portion.

In accordance with additional or alternative embodiments, the working fluid is a refrigerant.

According to another aspect of the disclosure, a power electronics unit including a semiconductor portion and an inductor portion is provided. The semiconductor portion includes at least one fan configured to transfer heat from the semiconductor portion. The inductor portion includes at least one conduit configured to receive a working fluid. The working fluid is configured to transfer heat from the inductor portion.

In accordance with additional or alternative embodiments, at least 60% of the heat generated by the power electronics unit is derived from the semiconductor portion.

In accordance with additional or alternative embodiments, less than 40% of the heat generated by the power electronics unit is derived from the inductor portion.

In accordance with additional or alternative embodiments, the at least one fan transfers substantially all of the heat derived from the semiconductor portion.

In accordance with additional or alternative embodiments, the working fluid transfers substantially all of the heat derived from the inductor portion.

According to another aspect of the disclosure, a method of cooling a power electronics unit is provided. The power electronics unit includes a semiconductor portion with at least one fan, and an inductor portion with at least one conduit. The method includes a step for passing a working fluid through the conduit. The working fluid transferring heat from the inductor portion. The method includes a step for operating at least one fan to transfer heat from the semiconductor portion.

In accordance with additional or alternative embodiments, the method further includes transferring an electrical power from the power electronics unit to an electric drive motor of a compressor, the compressor configured to change the pressure of the working fluid.

In accordance with additional or alternative embodiments, the heat generated by the power electronics unit is proportional to the transfer of the electrical power to the electric drive motor.

In accordance with additional or alternative embodiments, at least 60% of the heat generated by the power electronics unit is derived from the semiconductor portion, substantially all of the heat derived from the semiconductor is transferred by the at least one fan.

In accordance with additional or alternative embodiments, less than 40% of the heat generated by the power electronics unit is derived from the inductor portion, substantially all of the heat derived from the inductor portion is transferred by the working fluid.

BRIEF DESCRIPTION OF THE DRAWINGS

The subject matter, which is regarded as the disclosure, is particularly pointed out and distinctly claimed in the claims at the conclusion of the specification. The following descriptions of the drawings should not be considered limiting in any way. With reference to the accompanying drawings, like elements are numbered alike:

DETAILED DESCRIPTION

Vapor compression systems (e.g., incorporated within transport refrigeration units) commonly include a compressor, a condenser, an expansion valve, and an evaporator. Refrigerant circulates through the vapor compression system in order to provide cooling to a medium (e.g., the air within the cargo space of the truck/trailer). The refrigerant exits the compressor through a discharge port at a high pressure and a high enthalpy. The refrigerant then flows through the condenser at a high pressure and rejects heat to an external fluid medium (e.g., an air supply or a water supply). The refrigerant then flows through the expansion valve, which expands the refrigerant to a low pressure. After expansion, the refrigerant flows through the evaporator and absorbs heat from another medium (e.g., air). The refrigerant then re-enters the compressor through a suction port, completing the cycle.

To increase or decrease cooling, the operation (e.g., the speed) of compressor may be adjusted. For example, to increase cooling, the refrigerant may be circulated within the vapor compression system at an increased rate, and conversely, to decrease cooling, the refrigerant may be circulated at a slower rate. To control the operation of the compressor a power electronics unit may be utilized. It should be understood that the power electronics unit may be any electronic device/system that is capable of varying the speed of the compressor. The power electronics unit may include multiple components, each of which may necessitate different amounts of cooling. For example, particular components may produce more heat and thus may require more cooling. In certain instances, at least a portion of the power electronics unit is cooled using at least a portion of the refrigerant from a vapor compression system (e.g., of a transport refrigeration unit). To reduce the impact on the source of the refrigerant, a hybrid cooling system is provided. A hybrid cooling system is a system that incorporates both forced air cooling and liquid cooling.

Figure 1:
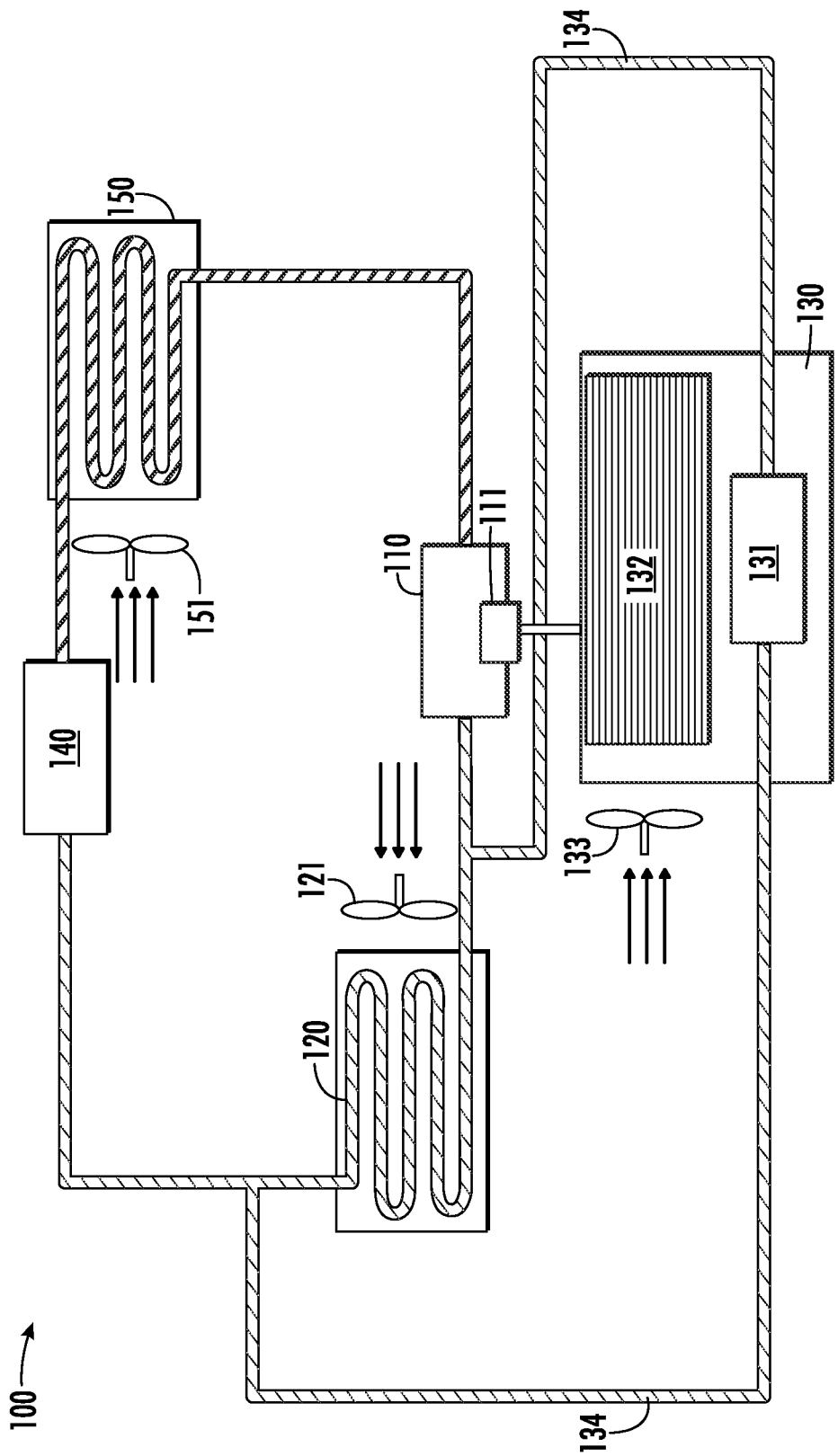
FIG. 1 is a schematic illustration of a vapor compression system including a compressor, a condenser, an evaporator, and an expansion valve, with a power electronics unit receiving working fluid from upstream of the evaporator, and the working fluid from the power electronics unit being transferred to the compressor in accordance with one aspect of the disclosure.

With reference now to the Figures, a schematic illustration of a vapor compression system 100 including a compressor 110, a condenser 150, an evaporator 120, and an expansion valve 140, with a power electronics unit 110 receiving a working fluid from upstream of the evaporator 120 is shown in FIG. 1. It should be appreciated that the working fluid may be any fluid capable of transferring heat (e.g., water, refrigerant, brine, etc.). It is envisioned that the driving force of the working fluid through the power electronics unit 110 may be the compressor 110 from the vapor compression system 100 (e.g., where no additional compressor or pump is needed separate from the existing compressor 110 of the vapor compressions system 100). The compressor 110 includes an electric drive motor 111 for increasing the pressure of the working fluid. It is envisioned that the electric drive motor 111 may be an AC or DC motor, which may be mounted to the compressor 110. The evaporator 120 is in fluid communication with the compressor 110. Being in fluid communication may be interpreted to mean that the evaporator 120 and the compressor 110 are included within the same vapor compression system 100 (e.g., where the working fluid that is passed through evaporator 120 is also passed through the compressor 110). The evaporator 120 is configured to transfer heat from an external medium (e.g., an air supply or a water supply) to the working fluid.

The power electronics unit 130 is used to control the transfer of an electrical power (e.g., from an on-board battery within the transport refrigeration unit) to the electric drive motor 111 (e.g., through one or more wired connections). The power electronics unit 130 includes a semiconductor portion 132 and an inductor portion 131. The semiconductor portion 132 includes at least one fan 133 configured to transfer heat from the semiconductor portion 132. The inductor portion 131 includes at least one conduit 134 configured to receive at least a portion of the working fluid (e.g., from upstream of the evaporator 120). The working fluid is used to transfer heat from the inductor portion 131.

Figure 2:
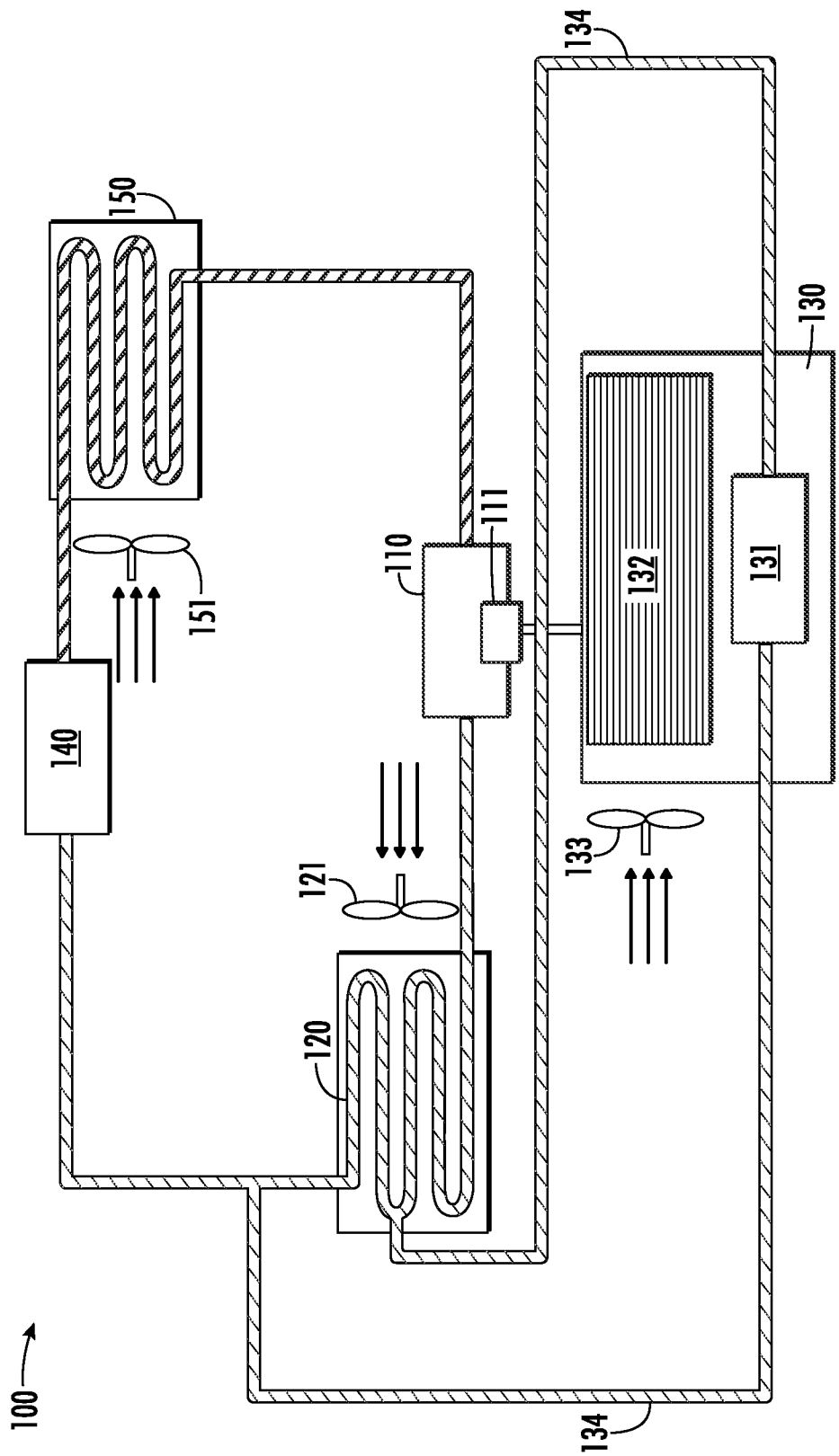
FIG. 2 is a schematic illustration of a vapor compression system including a compressor, a condenser, an evaporator, and an expansion valve, with a power electronics unit receiving working fluid from upstream of the evaporator, and the working fluid from the power electronics unit being transferred to the evaporator in accordance with one aspect of the disclosure.

Once used by the power electronics unit 130 to remove heat from the inductor portion 131, the working fluid may be sent either to the compressor 110 (as shown in FIG. 1), or to the evaporator 120 (as shown in FIG. 2). In certain instances, the working fluid may be sent from the power electronics unit 130 to both the compressor 110 and the evaporator 120. For example, a portion of the working fluid may be sent from the power electronics unit 130 to the compressor 110 and a portion of the working fluid may be sent from the power electronics unit 130 to the evaporator 120. It may be advantageous to send the working fluid from the power electronics unit 130 to the evaporator 120 when the heat produced by the inductor portion 131 is not sufficiently high enough to utilize the entire cooling capacity of the working fluid. Conversely, it may be advantageous to send the working fluid from the power electronics unit 130 to the compressor 110 when the heat produced by the inductor portion 131 is sufficiently high enough to utilize majority of the cooling capacity of the working fluid.

The heat generated by the power electronics unit 130 may be proportional to the transfer of the electrical power to the electric drive motor 111 of the compressor 110. For example, the power electronics unit 130 may generate more heat when more electrical power is transferred to the electric drive motor 111, and may generate less heat when less electrical power is transferred to the electric drive motor 111. Regardless of the amount of heat generated, the power electronics unit 130 may generate more heat in one portion than another. For example, the semiconductor portion 132 may generate more heat than the inductor portion 131. In certain instances, at least 60% of the heat generated by the power electronics unit 130 is derived from the semiconductor portion 132. In certain instances, less than 40% of the heat generated by the power electronics unit 130 is derived from the inductor portion 131. To minimize the impact on the vapor compression system (e.g., within the transport refrigeration unit), the semiconductor portion 132 may be air cooled (e.g., using one or more fan 133).

For example, at least one fan 133 may be used to transfer substantially all of the heat derived from the semiconductor portion 132. This may be interpreted to mean that the semiconductor portion 132 may not be cooled using any of the cooling capacity of the working fluid. Instead of cooling both the semiconductor portion 132 and the inductor portion 131 with working fluid, the system 100 solely uses working fluid to cool the inductor portion 131. In certain instances, the working fluid transfers substantially all of the heat derived from the inductor portion 131. This may be interpreted to mean that the inductor portion may only be cooled using working fluid. However, it should be appreciated that one or more fan 133 may be used to remove at least a portion of the generated by the inductor portion 131. For example, the fan 133 for the semiconductor portion 132 may be configured to direct an airflow over both the semiconductor portion 132 and the inductor portion 131. It is envisioned, however, that the inductor portion 131 may have a separate fan (not shown) dedicated to cooling the inductor portion 131.

By limiting the liquid cooling to only the inductor portion 131, the impact of the power electronics unit 130 on the vapor compression system 100 is minimized (e.g., by at least 60% compared to processes utilizing liquid cooling for the entire power electronics unit 130). Instead of using working fluid from the vapor compression system 100 to cool the entire power electronics unit 130, as has been done in prior applications, this system 100 utilizes a hybrid cooling technique to only provide liquid cooling to the inductor portion 131. As mentioned above, the inductor portion 131 is responsible for less than 40% of the heat generated by the power electronics unit 130, with the remaining amount (e.g., at least 60%) of the heat being attributable to the semiconductor portion 132, which is cooled using at least one fan 133.

Figure 3:
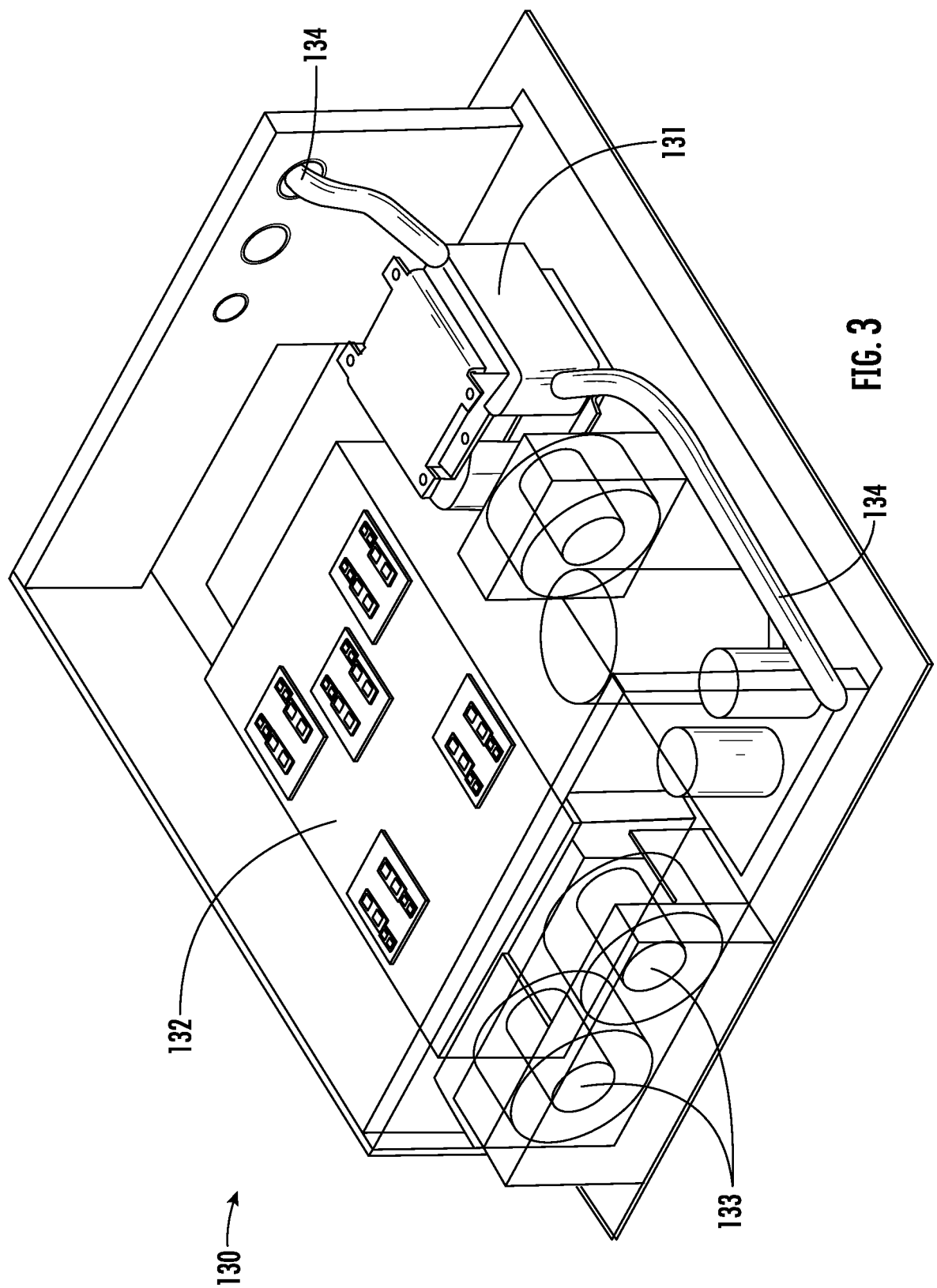
FIG. 3 is a perspective view of a power electronics unit, shown in FIGS. 1 and 2, with a semiconductor portion and an inductor portion in accordance with one aspect of the disclosure.

It should be appreciated that the ability to limit liquid cooling to only the inductor portion 131 may be possible because of the shape of the components (e.g., the shape of the semiconductor portion 132). As shown in FIG. 3, the semiconductor portion 132 may be designed to be relatively flat, which may make the semiconductor portion 132 easier to cool with air (e.g., with one or more fan 133 disposed near the semiconductor portion 132) than the inductor portion 131 (e.g., which may have a complex three-dimensional structure). To provide liquid cooling to the inductor portion 131 one or more conduits 134 may be used to circulate working fluid (e.g., refrigerant) either around or through the inductor portion 131. As shown, the working fluid may not flow through the conduits 134 either around or through the semiconductor portion 132, and as such may not provide any cooling for the semiconductor portion 132. As described above, this method of cooling may reduce the impact of the power electronics unit 130 on the source of the working fluid (e.g., the vapor compression system 100).

Figure 4:
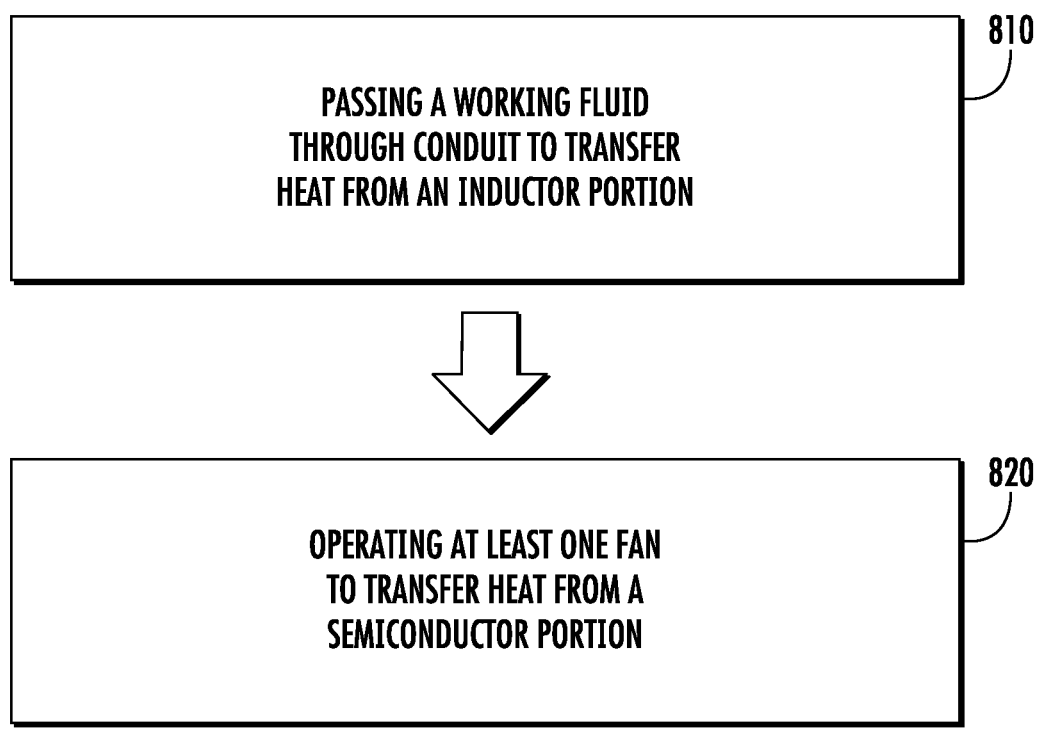
FIG. 4 is a flow diagram illustrating a method of cooling a power electronics unit in accordance with one aspect of the disclosure.

This method 800 of cooling a power electronics unit 130 is shown in FIG. 4. This method 800 may be completed, for example, using the exemplary power electronics unit 130 shown in FIG. 3 and/or the exemplary vapor compression systems shown in FIGS. 1 and 2. As described above, this method 800 may provide for forced air cooling (e.g., using one or more fan 133) for the semiconductor portion 132 of the power electronics unit 130, and liquid cooling (e.g., using one or more conduit 134) for the inductor portion 131 of the power electronics unit 130. This method 800 includes step 810 for passing a working fluid through a conduit 134 to the inductor portion 131 of the power electronics unit 130 to transfer heat from the inductor portion 131. The method 800 also includes step 820 for operating at least one fan 133 to transfer heat from the semiconductor portion 132 of the power electronics unit 130. As described above, this method 800 may reduce the impact of the power electronics unit 130 on the source of the working fluid by at least 60% relative to processes that utilize liquid cooling for the entire power electronics unit 130.

The use of the terms "a" and "and" and "the" and similar referents, in the context of describing the invention, are to be construed to cover both the singular and the plural, unless otherwise indicated herein or cleared contradicted by context. The use of any and all example, or exemplary language (e.g., "such as", "e.g.", "for example", etc.) provided herein is intended merely to better illuminate the invention and does not pose a limitation on the scope of the invention unless otherwise claimed. No language in the specification should be construed as indicating any non-claimed elements as essential to the practice of the invention.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A vapor compression system comprising:
a compressor comprising an electric drive motor for increasing the pressure of a working fluid;
an evaporator in fluid communication with the compressor, the evaporator configured to transfer heat from an external medium to the working fluid; and
a power electronics unit for controlling the transfer of an electrical power to the electric drive motor, the power electronics unit comprising:
a semiconductor portion comprising at least one fan configured to transfer heat from the semiconductor portion; and
an inductor portion comprising at least one conduit configured to receive at least a portion of the working fluid, the working fluid configured to transfer heat from the inductor portion, wherein less that 40% of the heat generated by the power electronics unit is derived from the inductor portion.

2. The vapor compression system of claim 1, wherein the inductor portion receives at least a portion of the working fluid from upstream of the evaporator.

3. The vapor compression system of claim 2, wherein the working fluid from the inductor portion is transferred to the compressor.

4. The vapor compression system of claim 2, wherein the working fluid from the inductor portion is transferred to the evaporator.

5. The vapor compression system of claim 1, wherein the heat generated by the power electronics unit is proportional to the transfer of the electrical power to the electric drive motor.

6. The vapor compression system of claim 5, wherein at least 60% of the heat generated by the power electronics unit is derived from the semiconductor portion.

7. The vapor compression system of claim 6, wherein the at least one fan transfers substantially all of the heat derived from the semiconductor portion.

8. The vapor compression system of claim 1, wherein the working fluid transfers substantially all of the heat derived from the inductor portion.

9. The vapor compression system of claim 1, wherein the working fluid is a refrigerant.

10. A power electronics unit comprising:
a semiconductor portion comprising at least one fan configured to transfer heat from the semiconductor portion; and
an inductor portion comprising at least one conduit configured to receive a working fluid, the working fluid configured to transfer heat from the inductor portion, wherein less than 40% of the heat generated by the power electronics unit is derived from the inductor portion.

11. The power electronics unit of claim 10, wherein at least 60% of the heat generated by the power electronics unit is derived from the semiconductor portion.

12. The power electronics unit of claim 11, the at least one fan transfers substantially all of the heat derived from the semiconductor portion.

13. The power electronics unit of claim 10, wherein the working fluid transfers substantially all of the heat derived from the inductor portion.

14. A method of cooling a power electronics unit, the power electronics unit comprising a semiconductor portion comprising at least one fan, and an inductor portion comprising at least one conduit, the method comprising:
passing a working fluid through the conduit, the working fluid transferring heat from the inductor portion, wherein less than 40% of the heat generated by the power electronics unit is derived from the inductor portion; and
operating at least one fan to transfer heat from the semiconductor portion.

15. The method of cooling a power electronics unit of claim 14, further comprising transferring an electrical power from the power electronics unit to an electric drive motor of a compressor, the compressor configured to change the pressure of the working fluid.

16. The method of cooling a power electronics unit of claim 15, wherein the heat generated by the power electronics unit is proportional to the transfer of the electrical power to the electric drive motor.

17. The method of cooling a power electronics unit of claim 16, wherein at least 60% of the heat generated by the power electronics unit is derived from the semiconductor portion, substantially all of the heat derived from the semiconductor portion is transferred by the at least one fan.

18. The method of cooling power electronics unit of claim 16, wherein substantially all of the heat derived from the inductor portion is transferred by the working fluid.

* * * * *